United States Patent
Lim (10) Patent No.: US 9,437,323 B2
(45) Date of Patent: Sep. 6, 2016

(54) SHIFT REGISTER CIRCUIT FOR PREVENTING MALFUNCTION DUE TO CLOCK SKEW AND MEMORY DEVICE INCLUDING THE SAME

(71) Applicant: SK hynix Inc., Gyeonggi-do (KR)

(72) Inventor: Soo-Bin Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/678,581

(22) Filed: Apr. 3, 2015

(65) Prior Publication Data
US 2016/0133336 A1 May 12, 2016

(30) Foreign Application Priority Data

Nov. 7, 2014 (KR) .................. 10-2014-0154246

(51) Int. Cl.
| | |
|---|---|
| G11C 8/00 | (2006.01) |
| G11C 7/00 | (2006.01) |
| G11C 19/00 | (2006.01) |
| G11C 19/28 | (2006.01) |
| G11C 7/10 | (2006.01) |
| G11C 7/22 | (2006.01) |
| G11C 16/26 | (2006.01) |
| G11C 16/32 | (2006.01) |

(52) U.S. Cl.
CPC ............. *G11C 19/00* (2013.01); *G11C 7/1066* (2013.01); *G11C 7/222* (2013.01); *G11C 16/26* (2013.01); *G11C 16/32* (2013.01); *G11C 19/28* (2013.01)

(58) Field of Classification Search
None
See application file for complete search history.

(56) References Cited

U.S. PATENT DOCUMENTS

| | | | | |
|---|---|---|---|---|
| 6,058,156 | A * | 5/2000 | Kanba ..................... | G11C 19/28 377/78 |
| 2006/0026473 | A1* | 2/2006 | Tan ................... | G01R 31/31859 714/726 |
| 2015/0186561 | A1* | 7/2015 | Teig ....................... | G06F 17/505 716/134 |
| 2015/0187436 | A1* | 7/2015 | Querbach ............. | G06F 11/263 714/720 |

FOREIGN PATENT DOCUMENTS

KR 1020070067615 6/2007

* cited by examiner

*Primary Examiner* — Son Dinh
*Assistant Examiner* — Sultana Begum
(74) *Attorney, Agent, or Firm* — IP & T Group LLP (57) ABSTRACT

A shift register circuit may include a first latch capable of latching an input signal in synchronization with a first clock, a first flip-flop capable of latching the output signal of the first latch in synchronization with a second dock having the same skew as the first clock, a second latch capable of latching the output signal of the first flip-flop in synchronization with a third clock having a different skew from the second clock, and a second flip-flop capable of latching the output signal of the second latch circuit in synchronization with a fourth clock having the same skew as the third clock.

12 Claims, 7 Drawing Sheets

SHIFT REGISTER CIRCUIT FOR PREVENTING MALFUNCTION DUE TO CLOCK SKEW AND MEMORY DEVICE INCLUDING THE SAME

CROSS-REFERENCE TO RELATED APPLICATION(S)

The present application claims priority of Korean Patent Application No. 10-2014-0154246, filed on Nov. 7, 2014, which is incorporated herein by reference in its entirety.

BACKGROUND

1. Field

Exemplary embodiments of the present invention relate to a shift register circuit and a memory device including the same and, more particularly, to a technology for preventing a malfunction of a shift register circuit attributable to clock skew.

2. Description of the Related Art

A shift register circuit includes a plurality of stages, shifts a signal from a previous stage to a next stage whenever a clock is activated, and stores the shifted signal. The shift register circuit is used in almost all types of semiconductor devices. The shift register circuit may be used to delay a specific signal in synchronization with a clock and may be used to sequentially activate a plurality of signals (i.e., signals at the plurality of stages) whenever a clock is activated.

Figure 1:
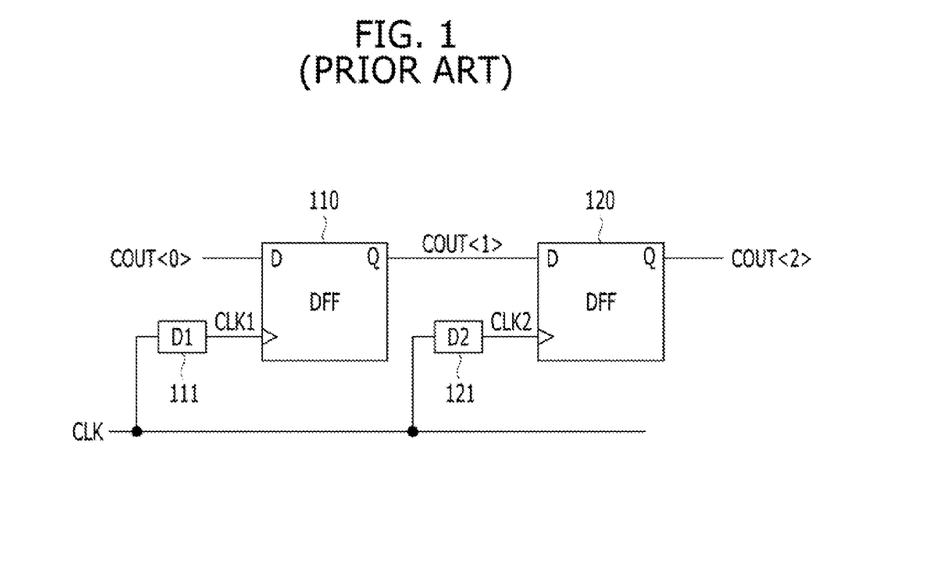
FIG. 1 illustrates the configuration of a typical shift register circuit.

FIG. 1 illustrates the configuration of a typical shift register circuit.

Referring to FIG. 1, the shift register circuit includes flip-flops 110 and 120 that are connected in series. FIG. 1 illustrates only two stages of the shift register circuit. The shift register circuit may include tens to hundreds of stages. The flip-flops 110 and 120 may be D flip-flops (DFF).

The flip-flops 110 and 120 receive the signals of respective input terminals D, latch the received signals and output the latched signals to respective output terminals Q, at the falling edges of respective input clocks CLK1 and CLK2.

In FIG. 1, "D1" and "D2" denote paths 111 and 121 in which clocks CLK are transferred. The paths 111 and 121 may ideally have a delay value of 0, but have some delay value because it is impossible for any signal transfer path to have the delay value of 0. The input clock CLK1 is a result of the clock CLK transferred via the path 111, and the input clock CLK2 is a result of the clock CLK transferred via the path 121. In principle, the clocks CLK, CLK1, and CLK2 are the same.

Figure 2:
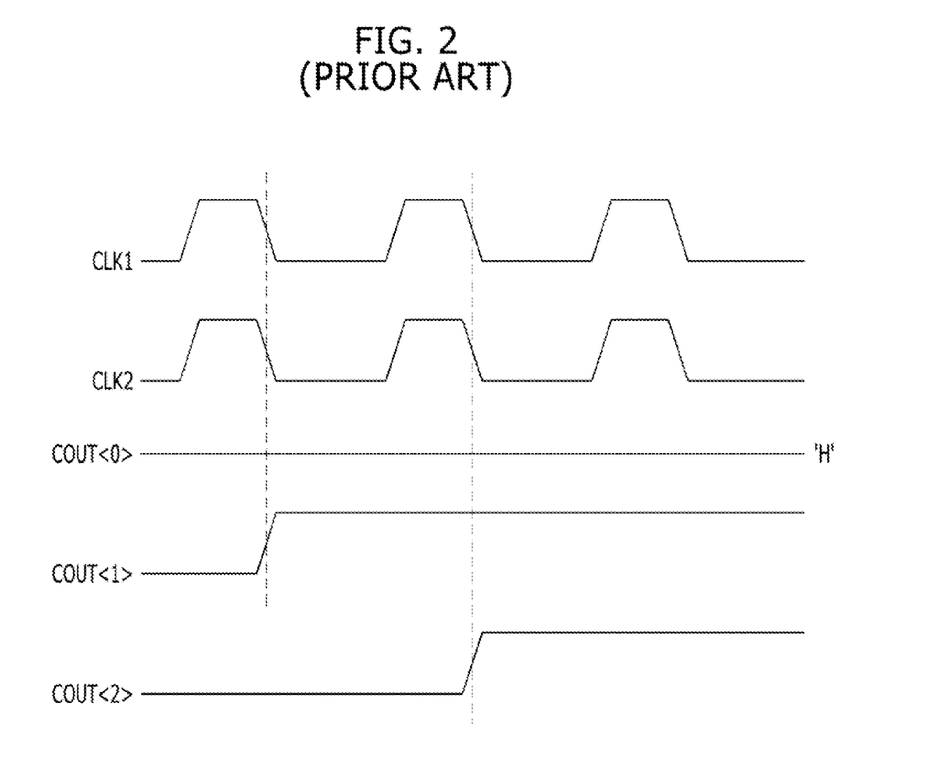
FIG. 2 is a diagram illustrating an ideal operation of the shift register circuit of FIG. 1.

FIG. 2 is a diagram illustrating an ideal operation of the shift register circuit of FIG. 1. FIG. 2 illustrates the operation of the shift register circuit if there is no skew difference (e.g., delay different) between the input clock CLK1 and the input clock CLK2.

Referring to FIG. 2, the flip-flop 110 receives its own input signal COUT<0>, latches the received input signal, and outputs the latched signal as an output signal COUT<1>, at the falling edge of the input clock CLK1. Furthermore, the flip-flop 120 receives its own input signal COUT<1> latches the received signal, and outputs the latched signal as an output signal COUT<2>, at the falling edge of the input clock CLK2.

Through the operation, the shift register circuit sequentially activates the signals COUT<1> and COUT<2> whenever the clock CLK is activated.

Figure 3:
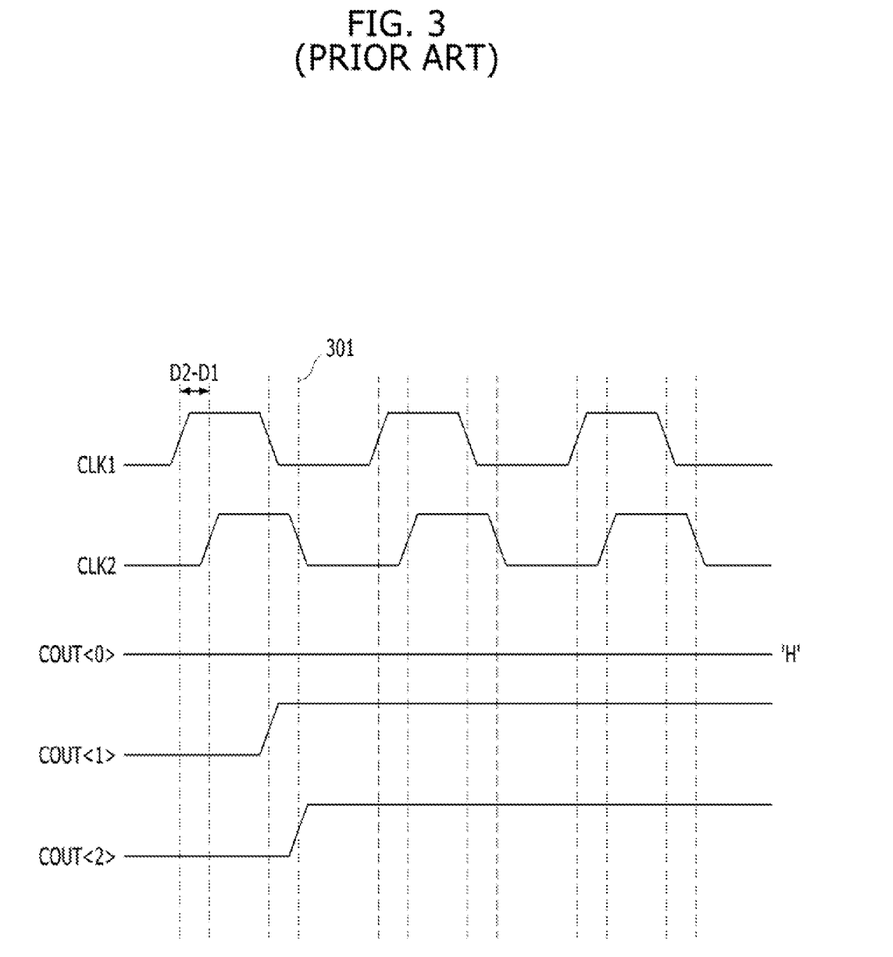
FIG. 3 is a diagram illustrating an erroneous operation of the shift register circuit of FIG. 1.

FIG. 3 is a diagram illustrating an erroneous operation of the shift register circuit of FIG. 1. FIG. 3 illustrates the operation of the shift register circuit if there is a skew difference between the input clock CLK1 and the input clock CLK2.

Referring to FIG. 3, the input clock CLK2 is activated later than the input clock CLK1 by a skew difference D2−D1. The flip-flop 110 receives the input signal COUT<0>, latches the received signal, and outputs the latched signal as the output signal COUT<1>, at the falling edge of the input clock CLK1. The input signal COUT<1> of the flip-flop 120 already has a "high" level at the falling edge a point of time 301) of the input clock CLK2. Accordingly, the flip-flop 120 receives the input signal COUT<1> latches the received signal, and outputs the output signal COUT<2> of a "high" level, at the falling edge (i.e., the point of time 301) of the input clock CLK2. The flip-flops 110 and 120 that form the shift register circuit are to make a difference between activation times of the respective output signals COUT<1> and COUT<2> at least by one cycle of the clock CLK. However, if an error occurs when the output signal COUT<1> of the flip-flop 110 and the output signal COUT<2> of the flip-flop 120 are activated at almost the same time, due to skew differences D2−D1 between the input clock CLK1 and the input clock CLK2.

The risk of such an error, shown in FIG. 3, is increased as the number of stages used in a shift register circuit increases and a skew between clocks used in the respective stages increases. Accordingly, there is a need for a technology capable of preventing such malfunction.

SUMMARY

Various embodiments are directed to providing a technology for preventing a shift register circuit from malfunctioning due to an increase in the stages of the shift register circuit and an increase in skews between clocks used in the respective stages.

In an embodiment, a shift register circuit may include a first latch capable of latching an input signal in synchronization with a first clock, a first flip-flop capable of latching an output signal of the first latch in synchronization with a second clock having the same skew as the first clock, a second latch capable of latching an output signal of the first flip-flop in synchronization with a third clock having a different skew from the second clock, and a second flip-flop capable of latching an output signal of the second latch circuit in synchronization with fourth clock having the same skew as the third clock.

Each of the first latch and the second latch may include a D latch, and each of the first flip-flop and the second flip-flop may include a D flip-flop.

Each of the first latch and the second latch may latch a corresponding input signal when a corresponding input clock has a logic low level, and each of the first flip-flop and the second flip-flop may latch a corresponding input signal at the falling edge of a corresponding input clock. Alternatively, each of the first latch and the second latch may latch a corresponding input signal when the corresponding input clock has a logic high level, and each of the first flip-flop and the second flip-flop may latch a corresponding input signal at the rising edge of a corresponding input clock.

In an embodiment, a shift register circuit may include a first region and a second region. The first region may include a first latch capable of latching an input signal in synchronization with a clock and $1^{st}$ to $N^{th}$ first flip-flops connected in series and capable of sequentially latching an output signal of the first latch in synchronization with the clock, wherein N is an integer of 2 or more. The second region may include a second latch capable of latching the output signal of the $N^{th}$ first flip-flop in synchronization with the clock and $1^{st}$ to $M^{th}$ second flip-flops connected in series and capable of sequentially latching an output signal of the second latch in synchronization with the clock, wherein M is an integer of 2 or more). The distance between the $N^{th}$ first flip-flop of the first region and the second latch of the second region may be at least 10 times longer than the distance between latches and flip-flops in previous and next stages within one of the first and second regions.

Each of the first latch and the second latch may include a D latch, and each of the $1^{st}$ to $N^{th}$ first flip-flops and the $1^{st}$ to $M^{th}$ second flip-flops may include a D flip-flop.

The clock may be inputted to the first and second regions with a skew difference therebetween.

In an embodiment, a memory device may include a nonvolatile memory circuit capable of storing repair data, data buses capable of transferring the repair data outputted by the nonvolatile memory circuit, a shift register circuit comprising first to $N^{th}$ stages and sequentially activating the output signals of the first to $N^{th}$ stages whenever a clock is activated, first to $N^{th}$ storage circuits each capable of storing the repair data from the data buses in response to the activation of a corresponding output signal of the output signals of the first to $N^{th}$ stages, and a plurality of memory banks capable of being repaired using the repair data stored in the first to $N^{th}$ storage circuits. Each of the first to $N^{th}$ stages may include a D latch capable of latching an input signal in synchronization with the clock and a D flip-flop capable of latching the output signal of the D latch in synchronization with the clock.

In an embodiment, a shift register circuit may include a first latch suitable of latching an input signal in synchronization with a clock, a first flip-flop capable of latching an output signal of the first latch in synchronization with the clock, a second latch capable of latching an output signal of the first flip-flop in synchronization with the clock, and a second flip-flop capable of latching an output signal of the second latch circuit in synchronization with the clock, wherein the first latch and the first flip-flop have a delay difference in a path to receive the clock from the second latch and the second flip-flop.

The first and second latches may latch the input signal and output signal of the first flip-flop, respectively, based on a logic level of the clock, and the first and second flip-flops may latch the respective output signals of the first and second latches based on an edge of the logic level of the clock.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween. Furthermore, when it is described that one "comprises" (or "includes") or has some elements, it should be understood that it may comprise (or include) or have only those elements, or it may comprise (or include) or have other elements as well as those elements if there is no specific limitation. The terms of a singular form may include plural forms unless referred to the contrary.

Figure 4:
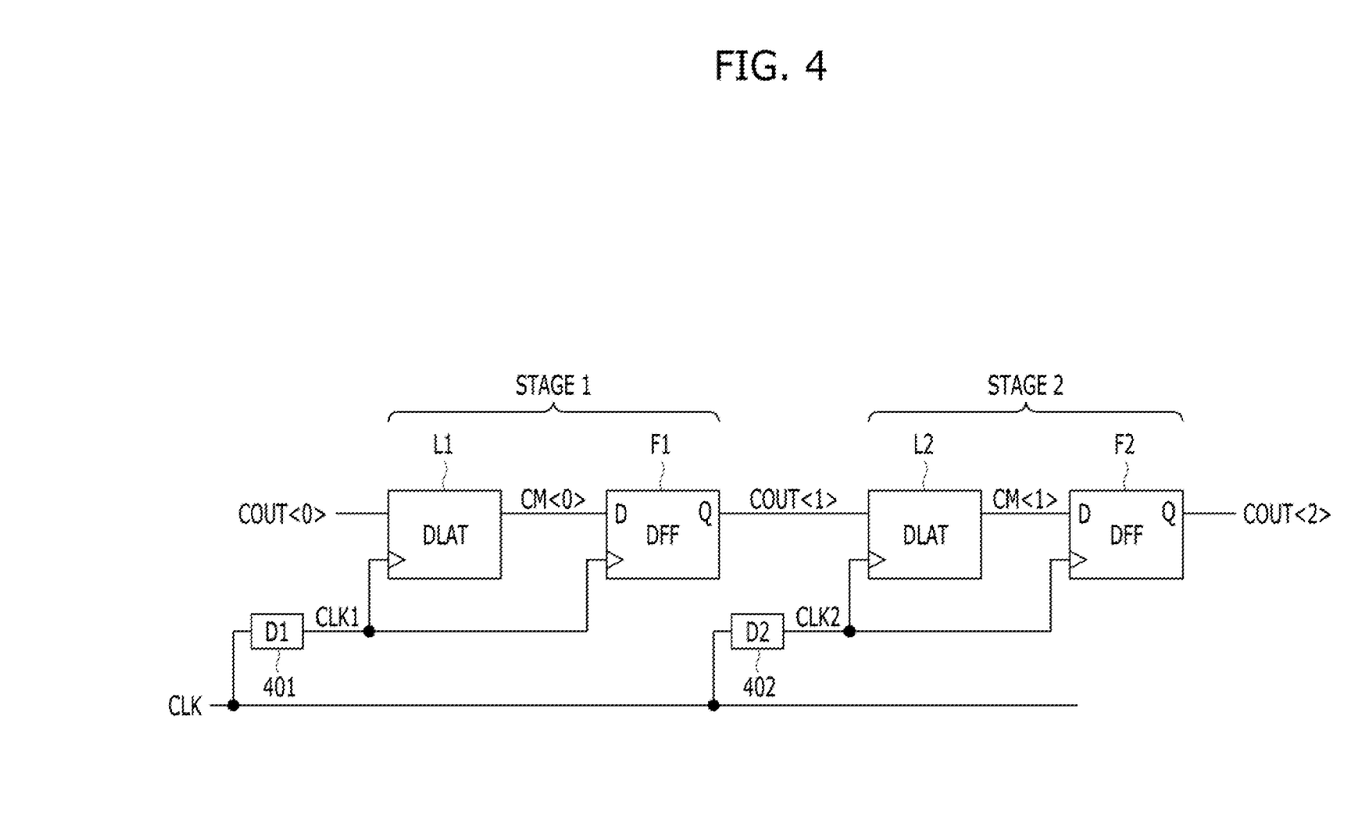
FIG. 4 illustrates the configuration of a shift register circuit in accordance with an embodiment of the present invention.

FIG. 4 illustrates the configuration of a shift register circuit in accordance with an embodiment of the present invention.

Referring to FIG. 4, the shift register circuit may include a first latch L1, a first flip-flop F1, a second latch L2, and a second flip-flop F2. FIG. 4 illustrates two stages STAGE1 and STAGE2 included in the shift register circuit, but the shift register circuit may include tens to hundreds of stages. The latches L1 and L2 may be D latches (DLAT), and the flip-flops F1 and F2 may be D flip-flops (DFF).

In FIG. 4, "D1" and "D2" may denote paths 401 and 402 in which a clock CLK is transferred. The paths 401 and 402 may ideally have a delay value of 0, but the paths 401 and 402 have a delay value (hereinafter, the delay value of the path 401 is called D1, and the delay value of the path 402 is called D2) because it is impossible for any signal transfer path to have the delay value of 0. The first latch L1 and flip-flop F1 of the stage STAGE1 may receive the clock CLK through the same path 401 because they are located very closely. The second latch L2 and flip-flop F2 of the stage STAGE2 may receive the clock CLK through the same path 402 because they are located very closely. There may be a skew difference between a clock CLK1 used in the stage STAGE1 and a clock CLK2 used in the stage STAGE2 because the path 401 in which the elements L1 and F1 of the stage STAGE1 receive the clock CLK is different from the path 402 in which the elements L2 and F2 of the stage STAGE2 receives the clock CLK.

The first latch L1 may receive an input signal COUT<0>, may latch the received signal, and may output the latched signal as an output signal CM<0> in a section in which the clock CLK1 has a level (i.e., a logic low level). Furthermore, the flip-flop F1 may receive the input signal CM<0> may latch the received signal, and may output the latched signal as an output signal COUT<1>, at the falling edge of the clock CLK1.

The second latch L2 may receive the input signal COUT<1>, may latch the received signal, and may output the latched signal as an output signal CM<1>, in a section in which the clock CLK2 has a "low" level. Furthermore, the flip-flop F2 may receive the input signal CM<1> may latch the received signal, and may output the latched signal as an output signal COUT<2>, at the falling edge of the clock CLK2.

The latches L1 and L2 present in the respective stages STAGE1 and STAGE2 may function to prevent a malfunction of the shift register circuit although there is a skew difference between the docks CLK1 and CLK2 used in the stages STAGE1 and STAGE2. This is described in detail with reference to FIG. 5.

Figure 5:
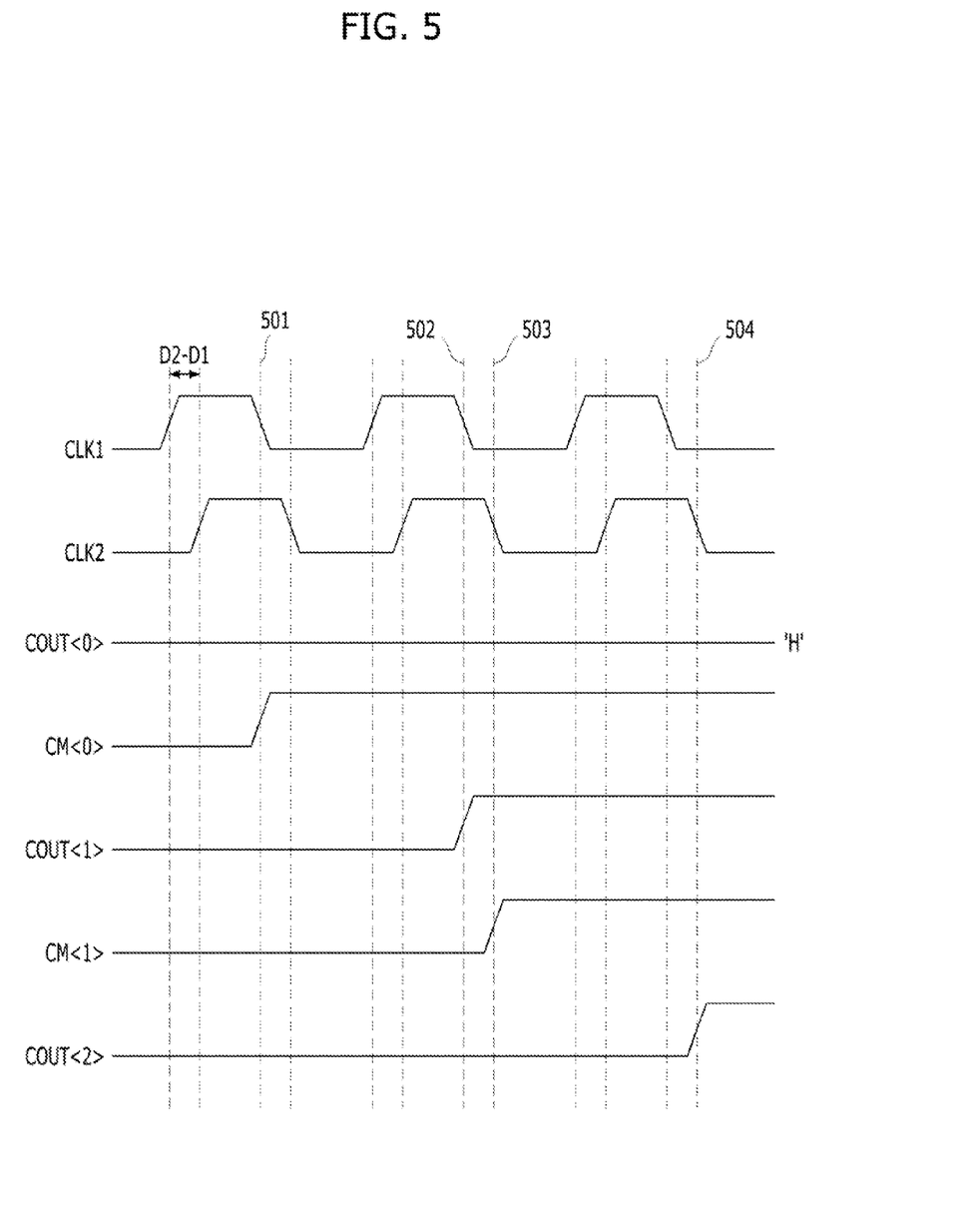
FIG. 5 is a diagram illustrating the operation of the shift register circuit of FIG. 4.

FIG. 5 is a diagram illustrating the operation of the shift register circuit of FIG. 4. From FIG. 5, it may be seen that the shift register circuit does not malfunction although there is a skew difference between the clocks CLK1 and CLK2.

Referring to FIG. 5, at a point of time 501 at which the clock CLK1 becomes a "low" level, the latch L1 may receive the input signal COUT<0>, may latch the received signal, and may output the latched signal as the output signal CM<0>. Furthermore, the flip-flop F1 may receive the input signal CM<0>, may latch the received signal, and may output the latched signal as the output signal COUT<1>, at the failing edge 502 of the clock CLK1.

The latch L2 may receive the input signal COUT<1>, may latch the received signal, and may output the latched signal as the output signal CM<1>, at a point of time 503 at which the clock CLK2 becomes a "low" level. Furthermore, the flip-flop F2 may receive the input signal CM<1>, may latch the received signal, and may output the latched signal as the output signal COUT<2>, at the falling edge 504 of the clock CLK2.

If the flip-flop F2 directly receives the output signal COUT<1> of the flip-flop F1 without the latch L2, a malfunction in which the output signal COUT<2> of a "high" level is outputted form the flip-flop F2 at the point of time 503 may occur. That is, an error, shown in FIG. 3, may occur. However, the shift register circuit may operate without an error although there is a skew difference between the clock CLK1 and the clock CLK2, because the flip-flop F2 receives the output signal of the flip-flop F1 through the latch L2 without directly receiving the output signal of the flip-flop F1.

FIGS. 4 and 5 have illustrated that the latches L1 and L2 are a negative type (i.e., the latch receives the input signal when the clock has a "low" level) and the flip-flops F1 are F2 are a falling edge trigger type. In contrast, the latches L1 and L2 may be a positive type (i.e., the latch receives the input signal when the clock has a "high" level) and the flip-flops F1 and F2 may be a rising edge trigger type. The same is true of the following embodiments.

Figure 6:
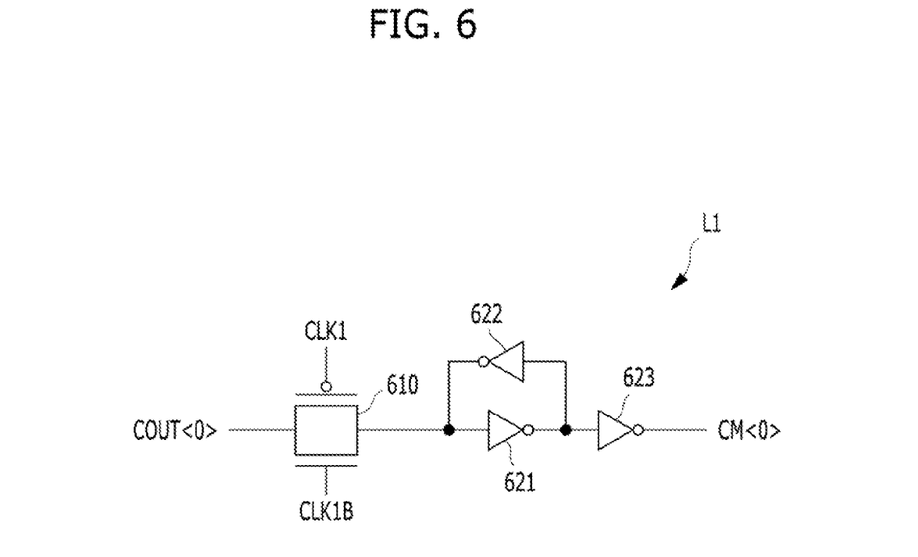
FIG. 6 illustrates a configuration of a latch L1 illustrated in FIG. 4 according to an embodiment.

FIG. 6 illustrates a configuration of the latch L1 illustrated in FIG. 4 according to an embodiment.

Referring to FIG. 6, the latch L1 may include a pass gate 610 turned on when the clock CLK1 has a "low" level and inverters 621, 622, and 623 configured to store and output a signal transferred through the pass gate 610. The latch L1 may receive and latch the input signal COUT<0> when the clock CLK1 has a "low" level and an inverted clock CLK1B of the clock CLK1 has a "high" level (i.e., a logic high level), and it may maintain a latched value when the clock CLK1 has a "high" level and the inverted clock CLK1B has a "low" level.

Figure 7:
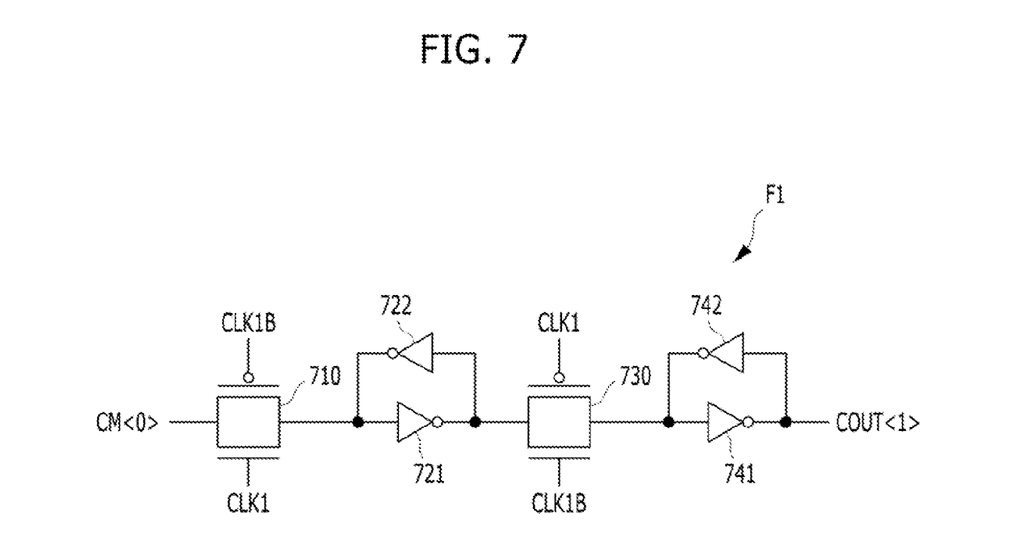
FIG. 7 illustrates a configuration of a flip-flop F1 illustrated in FIG. 4 according to an embodiment.

FIG. 7 illustrates a configuration of the flip-flop F1 illustrated in FIG. 4 according to an embodiment. The flip-flop F2 may also be designed as shown in FIG. 7.

Referring to FIG. 7, the flip-flop F1 may include a pass gate 710 turned on when the dock CLK1 has a "high" level, inverters 721 and 722 configured to store a signal transferred through the pass gate 710, a pass gate 730 turned on when the clock CLK1 has a "low" level, and inverters 741 and 742 configured to store a signal transferred through the pass gate 730. The flip-flop F1 may sample the input signal CM<0>, may store the sampled signal, and may provide the stored signal as the output signal COUT<1>, at the falling edge of the clock CLK1.

Figure 8:
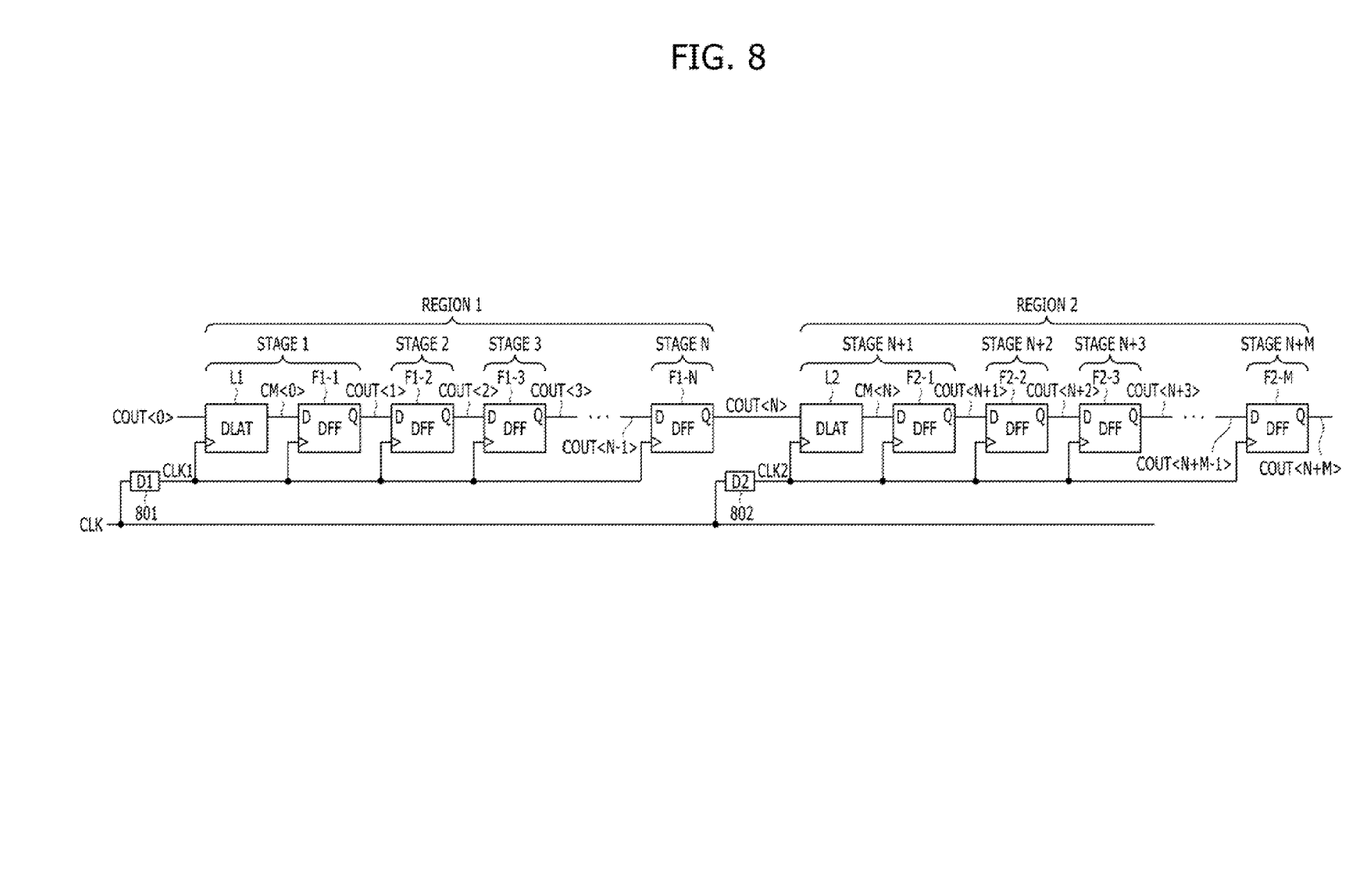
FIG. 8 illustrates the configuration of a shift register circuit in accordance with another embodiment of the present invention.

FIG. 8 illustrates the configuration of a shift register circuit in accordance with another embodiment of the present invention.

Referring to FIG. 8, the shift register circuit may include a first region REGION1 and a second region REGION2. The first region REGION1 may include a first latch L1 and $(1-1)^{th}$ to $(1-N)^{th}$ flip-flops F1-1~F1-N (N is an integer of 2 or more). The second region REGION2 may include a second latch L2 and $(2-1)^{th}$ to $(2-M)^{th}$ flip-flops F2-1~F2-M (M is an integer of 2 or more).

The first region REGION1 may be a region including the first to $N^{th}$ stages STAGE1~STAGEN of the shift register circuit. The second region REGION2 may be a region including the $(N+1)^{th}$ to $(N+M)^{th}$ stages STAGEN+1~STAGEN+M of the shift register circuit. There may be no skew difference between clocks CLK1 that are used in the first region REGION1 because the physical distance between the elements L1 and F1-1~F1-N in the first region REGION1 is short. Likewise, there may be no skew difference between clocks CLK2 that are used in the second region REGION2 because the physical distance between the elements L2 and F2-1~F2-M in the second region REGION2 is short. In contrast, there may be a skew difference between the clock CLK1 used in the first region REGION1 and the clock CLK2 used in the second region REGION2 because the distance between the first region REGION1 and the second region REGION2 is relatively long. For example, the distance between the flip-flop F1-N, that is, the last stage of the first region REGION1, and the latch L2, that is, the first stage of the second region REGION2, may be at least 10 times greater than the distance between previous and next stages in the same region (e.g., the second stage STAGE2 and the third stage STAGE3 in the first region REGION1).

From FIG. 8, it may be seen that a latch is not used in all the stages STAGE1~STAGEN+M of the shift register circuit, but only the two latches L1 and L2 are used in the respective regions REGION1 and REGION2. There is no malfunction in the same region of the shift register circuit because there is no skew difference between clocks that are used in the same region (e.g., between the clocks CLK1 used in the second stage STAGE2 and the third stage STAGE3). However, there is a risk that the shift register circuit may malfunction at the boundary of the regions REGION1 and REGION2 because there is a skew difference between the clocks that are used in the different regions REGION1 and REGION2 (i.e., between the clock CLK1 used in the $N^{th}$ stage STAGEN and the clock CLK2 used in the $(N+1)^{th}$ stage STAGEN+1. In order to reduce the risk, the latches L1 and L2 are used only at the boundaries of the regions REGION1 and REGION2, that is, at the first stages of the regions REGION1 and REGION2.

In the shift register circuit of FIG. 8, a latch is not used where there is no risk of malfunction because there is no skew difference between clocks, but a latch is used at the place where there is a risk of malfunction because there is a skew difference between clocks.

Accordingly, when the same number of stages is included, the shift register circuit of FIG. 8 may reduce the required area while preventing malfunctions, compared to the shift register circuit of FIG. 3.

Figure 9:
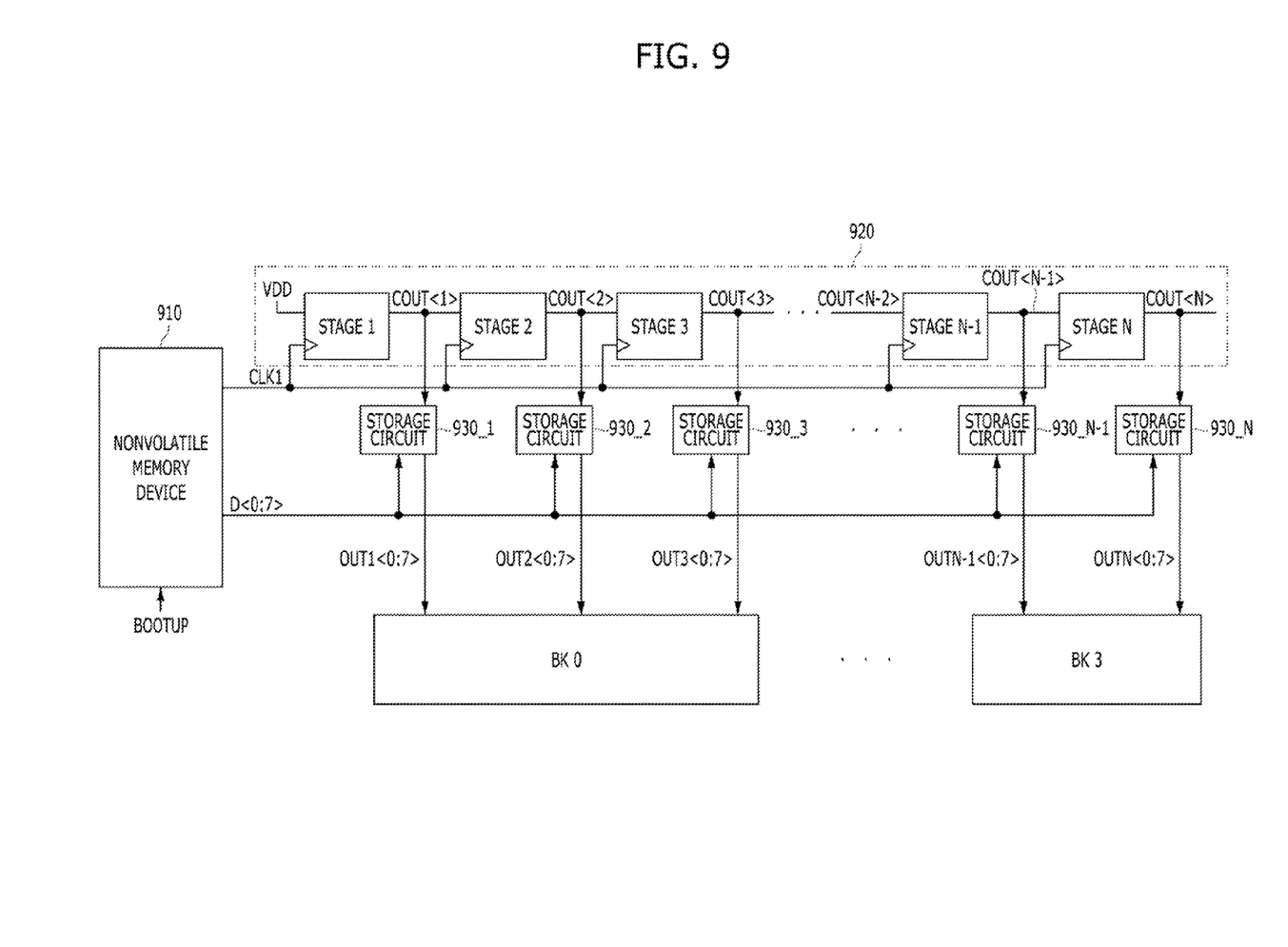
FIG. 9 illustrates the configuration of a memory device in accordance with an embodiment of the present invention.

FIG. 9 illustrates the configuration of a memory device in accordance with an embodiment of the present invention. An example in which the shift register circuit of FIG. 4 has been applied to a memory device is described with reference to FIG. 9.

Referring to FIG. 9, the memory device may include a nonvolatile memory circuit 910, data buses D<0:7>, a shift register circuit 920, first to $N^{th}$ storage circuits 930_1~930_N, and a plurality of memory banks BK0~BK3.

The nonvolatile memory circuit 910 may store the repair data of the memory banks BK0~BK3. The repair data is data indicative of defective memory cells in the memory banks BK0~BK3. The repair data may be used to replace defective memory cells in the memory banks BK0~BK3 with redundancy memory cells, The nonvolatile memory circuit 910 may sequentially output all the stored repair data to the data buses D<0:7> in response to the activation of a boot-up signal BOOTUP. A clock CLK outputted by the nonvolatile memory circuit 910 may have been synchronized with data transmitted to the data buses D<0:7>. The nonvolatile memory circuit 910 may include any one of an E-fuse array circuit, NAND flash memory, NOR flash memory, EPROM, EEPROM, FRAM, and MRAM.

The shift register circuit 920 may include first to $N^{th}$ stages STAGE1~STAGEN and may sequentially activate the output signals COUT<1>~COUT<N> of the first to $N^{th}$ stages STAGE1~STAGEN whenever the clock CLK is activated. For example, the shift register circuit 920 may activate the output signal COUT<1> when the clock CLK is first activated and may activate the output signal COUT<2> when the clock CLK is activated second. Like each of the stages STAGE1 and STAGE2 of FIG. 4, each of the first to $N^{th}$ stages STAGE1~STAGEN may include a D latch L and a D flip-flop F. The same clock CLK is used in the stages STAGE1~STAGEN, but there may be a skew difference between the docks CLK used in the stages STAGE1~STAGEN because the physical locations of the stages STAGE1~STAGEN are different from one another. The shift register circuit 920 may operate without an error although a skew difference is present between the docks used in the respective stages STAGE1~STAGEN because the D latch L is included in each of the stages STAGE1~STAGEN of the shift register circuit 920 as described above.

Each of the first to $N^{th}$ storage circuits 930_1~930_N may receive and store data through the data buses D<0:7> at a point of time at which a corresponding one of the output signals COUT<1>~COUT<N> of the first to $N^{th}$ stages STAGE1~STAGEN is activated. For example, the third storage circuit 930_3 may receive and store data through the data buses D<0:7> when the output signal COUT<3> of the third stage STAGE3 is activated in a "high" level. The fourth storage circuit 930_4 (not shown) may receive and store data through the data buses D<0:7> when the output signal COUT<4> of the fourth stage STAGE4 (not shown) is activated in a "high" level. Through such an operation, repair data that is first outputted by the nonvolatile memory circuit 910 may be stored in the first storage circuit 930_1, and repair data that is secondly outputted by the nonvolatile memory circuit 910 may be stored in the second storage circuit 930_2, and repair data that is outputted at third to $N^{th}$ positions in the sequence by the nonvolatile memory circuit 910 may be stored in the third to $N^{th}$ storage circuits 930_3~930_N.

The memory banks BK0~BK3 may be repaired using repair data OUT1<0:7>~OUTN<0:7> stored in the first to $N^{th}$ storage circuits 930_1~930_N. For example, if N is 100, the memory bank BK0 may be repaired using repair data OUT1<0:7>~OUT25<0:7> stored in the first to $25^{th}$ storage circuits 930_1~930_25, and the memory bank BK1 may be repaired using repair data OUT26<0:7>~OUT50<0:7> stored in the $26^{th}$ to $50^{th}$ storage circuits 930_26~930_50, and the memory bank BK2 may be repaired using repair data OUT51<0:7>~OUT75<0:7> stored in the $51^{st}$ to $75^{th}$ storage circuits 930_51-930_75, and the memory bank BK3 may be repaired using repair data OUT76<0:7~OUT100<0:7> stored in the $76^{th}$ to $100^{th}$ storage circuits 930_76~930_100. In this case, repairing the memory bank may mean that memory cells (i.e., defective memory cells) designated by repair data are replaced with redundancy memory cells in the memory bank.

In accordance with embodiments of the present invention, the shift register circuit may not malfunction although there is a skew deference between clocks used in the respective stages of the shift register circuit.

Although various embodiments have been described for illustrative purposes, it will be apparent to those skilled in the art that various changes and modifications may be made without departing from the spirit and scope of the invention as defined in the following claims.

What is claimed is:

1. A shift register circuit, comprising:
   a first D latch capable of latching an input signal in synchronization with a first clock;
   a first D flip-flop capable of latching an output signal of the first D latch in synchronization with a second clock having the same skew as the first clock;
   a second D latch capable of latching an output signal of the first D flip-flop in synchronization with a third clock having a different skew from the second clock; and
   a second D flip-flop capable of latching an output signal of the second D latch circuit in synchronization with a fourth clock having the same skew as the third clock.

2. The shift register circuit of claim 1, wherein:
   each of the first D latch and the second D latch latches a corresponding input signal when a corresponding input clock has a logic low level; and
   each of the first D flip-flop and the second D flip-flop latches a corresponding input signal at a falling edge of a corresponding input clock.

3. The shift register circuit of claim 1, wherein:
   each of the first D latch and the second D latch latches a corresponding input signal when the corresponding input clock has a logic high level; and
   each of the first D flip-flop and the second D flip-flop latches a corresponding input signal at a rising edge of a corresponding input clock.

4. A shift register circuit, comprising:
   a first region and a second region,
   wherein the first region comprises:
   a first D latch capable of latching an input signal in synchronization with a first clock, and $1^{st}$ to $N^{th}$ first D flip-flops connected in series and capable of sequentially latching an output signal of the first D latch in synchronization with the first clock, wherein N is an integer of 2 or more;

wherein the second region comprises:

a second D latch capable of latching an output signal of the $N^{th}$ first flip-flop in synchronization with a second clock; and $1^{st}$ to $M^{th}$ second D flip-flops connected in series and capable of sequentially latching an output signal of the second D latch in synchronization with the second clock, wherein M is an integer of 2 or more; and wherein a distance between the $N^{th}$ first D flip-flop of the first region and the second D latch of the second region is at least 10 times longer than a distance between D latches and D flip-flops in previous and next stages within one of the first and second regions.

5. The shift register circuit of claim 4, wherein:

each of the first D latch and the second D latch latches a corresponding input signal when a corresponding input clock has a logic low level; and each of the $1^{st}$ to $N^{th}$ D first flip-flops and the $1^{st}$ to $M^{th}$ second D flip-flops latches a corresponding input signal at a falling edge of a corresponding input clock.

6. The shift register circuit of claim 4, wherein:

each of the first D latch and the second D latch latches a corresponding input signal when a corresponding input clock has a logic high level; and each of the $1^{st}$ to $N^{th}$ first D flip-flops and the $1^{st}$ to $M^{th}$ second D flip-flops latches a corresponding input signal at a rising edge of a corresponding input clock.

7. The shift register circuit of claim 4, wherein the first clock and the second clock have a skew difference there between.

8. A memory device, comprising:

a nonvolatile memory circuit capable of storing repair data;

data buses capable of transferring the repair data outputted by the nonvolatile memory circuit;

a shift register circuit comprising first to $N^{th}$ stages and sequentially activating output signals of the first to $N^{th}$ stages whenever a clock is activated;

first to $N^{th}$ storage circuits each capable of storing the repair data from the data buses in response to an activation of a corresponding output signal of the output signals of the first to $N^{th}$ stages; and a plurality of memory banks capable of being repaired using the repair data stored in the first to $N^{th}$ storage circuits, wherein each of the first to $N^{th}$ stages comprises:

a D latch capable of latching an input signal in synchronization with the clock; and a D flip-flop capable of latching an output signal of the D latch in synchronization with the clock, and wherein the clock transferred to each of the first to Nth stages have a skew difference there between.

9. The memory device of claim 8, wherein:

the D latch latches the input signal when the clock has a logic low level; and the D flip-flop latches the output signal of the D latch at a falling edge of the clock.

10. The memory device of claim 8, wherein:

the D latch latches the input signal when the clock has a logic high level; and the D flip-flop latches the output signal of the D latch at a rising edge of the clock.

11. A shift register circuit, comprising:

a first D latch capable of latching an input signal in synchronization with a clock;

a first D flip-flop capable of latching an output signal of the first latch in synchronization with the clock;

a second D latch capable of latching an output signal of the first flip-flop in synchronization with the clock; and a second D flip-flop capable of latching an output signal of the second latch circuit in synchronization with the clock, wherein the first D latch and the first D flip-flop have a delay difference due to having different paths in which they receive the clock from the second D latch and the second D flip-flop.

12. The shift register circuit of claim 11, wherein:

the first and second D latches latch the input signal and output signal of the first D flip-flop, respectively, based on a logic level of the clock; and the first and second D flip-flops latch the respective output signals of the first and second D latches based on an edge of the logic level of the clock.

* * * * *